(12) United States Patent
Huang et al.

(10) Patent No.: US 12,283,896 B2
(45) Date of Patent: Apr. 22, 2025

(54) COMPUTER POWER SUPPLY ASSEMBLY

(71) Applicant: COOLER MASTER DEVELOPMENT CORPORATION, New Taipei (TW)

(72) Inventors: Chung Tsai Huang, New Taipei (TW); Chih Hsiang Chung, New Taipei (TW); Zhao Yi Wu, New Taipei (TW); Chi An Hsu, New Taipei (TW)

(73) Assignee: COOLER MASTER DEVELOPMENT CORPORATION, New Taipei (TW)

( * ) Notice: Subject to any disclaimer, the term of this patent is extended or adjusted under 35 U.S.C. 154(b) by 453 days.

(21) Appl. No.: 16/594,786

(22) Filed: Oct. 7, 2019

(65) Prior Publication Data

US 2021/0103321 A1 Apr. 8, 2021

(51) Int. Cl.
| | |
|---|---|
| *G06F 1/26* | (2006.01) |
| *G06F 1/18* | (2006.01) |
| *H01R 13/66* | (2006.01) |
| *H02M 7/00* | (2006.01) |
| *H02M 7/02* | (2006.01) |
| *H05K 5/02* | (2006.01) |
| *H05K 7/14* | (2006.01) |
| *H02M 3/00* | (2006.01) |

(52) U.S. Cl.
CPC .......... *H02M 7/003* (2013.01); *G06F 1/181* (2013.01); *G06F 1/188* (2013.01); *G06F 1/263* (2013.01); *H01R 13/665* (2013.01); *H02M 7/02* (2013.01); *H05K 5/0217* (2013.01); *H05K 7/1432* (2013.01); *H02M 3/003* (2021.05)

(58) Field of Classification Search
CPC ..................................... G06F 1/32; G06F 1/26
See application file for complete search history.

(56) References Cited

U.S. PATENT DOCUMENTS

| 5,930,110 A * | 7/1999 | Nishigaki | G06F 1/1632 |
| | | | 361/679.57 |
| 6,255,744 B1 * | 7/2001 | Shih | H02J 9/061 |
| | | | 307/64 |
| 10,401,923 B2 * | 9/2019 | Chuang | G06F 1/189 |
| 2001/0007134 A1 * | 7/2001 | Odaohhara | H02J 1/001 |
| | | | 713/300 |
| 2004/0003306 A1 * | 1/2004 | Oomori | H02J 1/102 |
| | | | 713/300 |
| 2004/0010649 A1 * | 1/2004 | Weaver | H02J 9/00 |
| | | | 307/66 |

(Continued)

*Primary Examiner* — Phil K Nguyen
(74) *Attorney, Agent, or Firm* — Dickinson Wright PLLC

(57) ABSTRACT

A computer power supply assembly (PSA) is provided. The PSA comprises an AC/DC power supply unit (PSU) and a DC/DC converter module. The DC/DC converter module is attached to the AC/DC power supply unit via conductor which may be a conductive bridge that holds the AC/DC PSU in fixed relation to the DC/DC converter module, or may be a conductive cable with, for example, a twist connector. The DC/DC converter module is replaceable and interchangeable. Different types of DC/DC converter modules having different numbers and combinations of connectors for attachment to the electronics system devices and different wattage and efficiency can be electrically connected to the PSU via the one conductor.

15 Claims, 13 Drawing Sheets

(56) References Cited

U.S. PATENT DOCUMENTS

| | | | | |
|---|---|---|---|---|
| 2004/0243826 A1* | 12/2004 | Wang | | G06F 21/81 |
| | | | | 713/193 |
| 2005/0146223 A1* | 7/2005 | Kanouda | | G06F 1/30 |
| | | | | 307/66 |
| 2006/0217905 A1* | 9/2006 | Pai | | G06F 1/26 |
| | | | | 702/60 |
| 2007/0217127 A1* | 9/2007 | Pan | | H05K 7/20136 |
| | | | | 361/601 |
| 2007/0290662 A1* | 12/2007 | Lan | | H02M 3/10 |
| | | | | 323/266 |
| 2008/0102662 A1* | 5/2008 | Barsun | | G06F 1/188 |
| | | | | 439/107 |
| 2010/0038974 A1* | 2/2010 | Imperial | | H02J 7/0042 |
| | | | | 320/137 |
| 2010/0176656 A1* | 7/2010 | Chung | | G09G 3/3611 |
| | | | | 307/31 |
| 2010/0250977 A1* | 9/2010 | Huang | | G06F 1/28 |
| | | | | 713/300 |
| 2010/0277151 A1* | 11/2010 | Tsai | | H02M 3/1584 |
| | | | | 323/283 |
| 2011/0246795 A1* | 10/2011 | Kuo | | G06F 1/26 |
| | | | | 713/300 |
| 2013/0119768 A1* | 5/2013 | Chang | | H02J 7/34 |
| | | | | 307/66 |
| 2013/0293018 A1* | 11/2013 | Wu | | G06F 1/305 |
| | | | | 307/66 |
| 2013/0322128 A1* | 12/2013 | Takegami | | H02M 3/33507 |
| | | | | 363/17 |
| 2014/0160652 A1* | 6/2014 | Cai | | H05K 7/1487 |
| | | | | 361/679.02 |
| 2015/0043256 A1* | 2/2015 | Domingo | | H02H 7/1227 |
| | | | | 363/52 |
| 2017/0179745 A1* | 6/2017 | Tritschler | | B60L 53/24 |
| 2018/0306870 A1* | 10/2018 | Maruoka | | G01R 31/40 |
| 2018/0314318 A1* | 11/2018 | Remis | | G06F 1/26 |
| 2018/0358821 A1* | 12/2018 | Li | | H01R 27/02 |
| 2019/0146564 A1* | 5/2019 | Arndt | | G06F 1/305 |
| | | | | 713/340 |

* cited by examiner

COMPUTER POWER SUPPLY ASSEMBLY

TECHNICAL FIELD

Exemplary embodiments described herein relate generally to the field of power conversion and, more particularly, to computer power supply units having moveable and interchangeable converter modules.

BACKGROUND

With the continued popularity of laptop and tablet computers due to portability and adequate performance at lower-costs, desktop computers have morphed into being specialized systems. Home servers, offering over four terabytes in a single drive and multiple drives, provide system specifications difficult to match for laptop computers. This is similar for gaming systems, media center systems and video editing systems.

Specialized desktop computers, servers or electronics systems have high functionality and applicability, and require high speed processors to operate. With an increase in operating speed and an increase in the number of processors employed, power requirements of the electronics systems also increase.

During operation of specialized electronics systems, high-voltage AC power from a wall outlet is converted to DC power via a power supply unit (PSU) so that the systems have proper low-voltage DC power to run constituent components. Most components of specialized electronics systems (the electronic chips on the motherboard and adapters, the electronics on the drives, and the motors in the hard drive and optical drive) need DC power to operate. The electronics system components employed in particular specialized electronics systems determines the type of form factor needed for the computer case, motherboard, and PSU. One applicable open and nonproprietary form factor is the Advanced Technology Extended (ATX) form factor originally developed in 1995 by Intel.

An ATX v2 compliant PSU plugs a 24-pin power cable to a 24-pin P1 connector on an ATX v2 compliant motherboard. The pins generally provide +3.3 volts, −5 volts, +5 volts, +12 volts, and −12 volts to the electronic chips on the motherboard and adapters. Eighteen additional power cables may also be provided in an ATX v2 compliant PSU, including two 4-pin or 8-pin +12 volts auxiliary motherboard cables used for extra power to the processor, four Molex 4-pin cables used for IDE drives such as hard drives, optical drives, and some video cards, eight SATA connector used for SATA drives such as hard drives and optical drives, four 6-pin plus 2-pin +12 volts cables used by high-end video cards using PCIe x16 slots to provide extra voltage to the card. Despite pairing with an ATX v2 compliant computer case and motherboard, a conventional non-modular ATX v2 compliant PSU, having at least nineteen power cables permanently attached thereto, increases time and complexity for cable management and decreases air-cooling efficiency throughout the inside of the electronics system housing. While modular or semi-modular PSUs allow for detachable power cables, lack of power cable standardization increases maintenance time and replacement convenience. In addition, a larger size due to the end connectors (around 2 cm extra in length) may lead to installation problems.

In addition to the electronics system components in the specialized electronics systems determining the type of form factor needed for the computer case, motherboard, and PSU, they also determine the required wattage and efficiency. As the electronics system components in the specialized electronics systems change over time, the required wattage and efficiency may also change. Should the new electronics system components require increased wattage and efficiency for the electronics system; the entire PSU will need to be replaced to maintain electronics system performance.

Conventional power supply units 100, as illustrated in FIGS. 1A-1D assemble large capacitors 164, coils 166, heat sinks 168, and other components tightly in a single enclosure. Because these components generate heat, the bigger the capacity of the power supply unit, the more heat is generated. Fans 152 or more exotic cooling solutions are used to cool the components to prevent damage or failure.

Yet another problem with conventional power supply units relates to the main current carrying circuit board. Because the main DC power conductor is a circuit board trace, in order to increase the power supplying capacity, the circuit board trace needs to be made wider to increase the cross-sectional area. However, as power supply requirements increase, even with relatively wide traces, the resistance of small cross section circuit board traces generate excess heat when carrying large currents. This wastes energy in the form of dissipated heat, and can even cause ablation of the circuit board, resulting in damage and possible failure of the power supply unit.

BRIEF DESCRIPTION OF THE DRAWINGS

To assist those of ordinary skill in the relevant art in understanding the subject matter hereof, reference is made to the appended drawings, in which like reference numerals refer to like elements, features and structures.

Figure 1A:
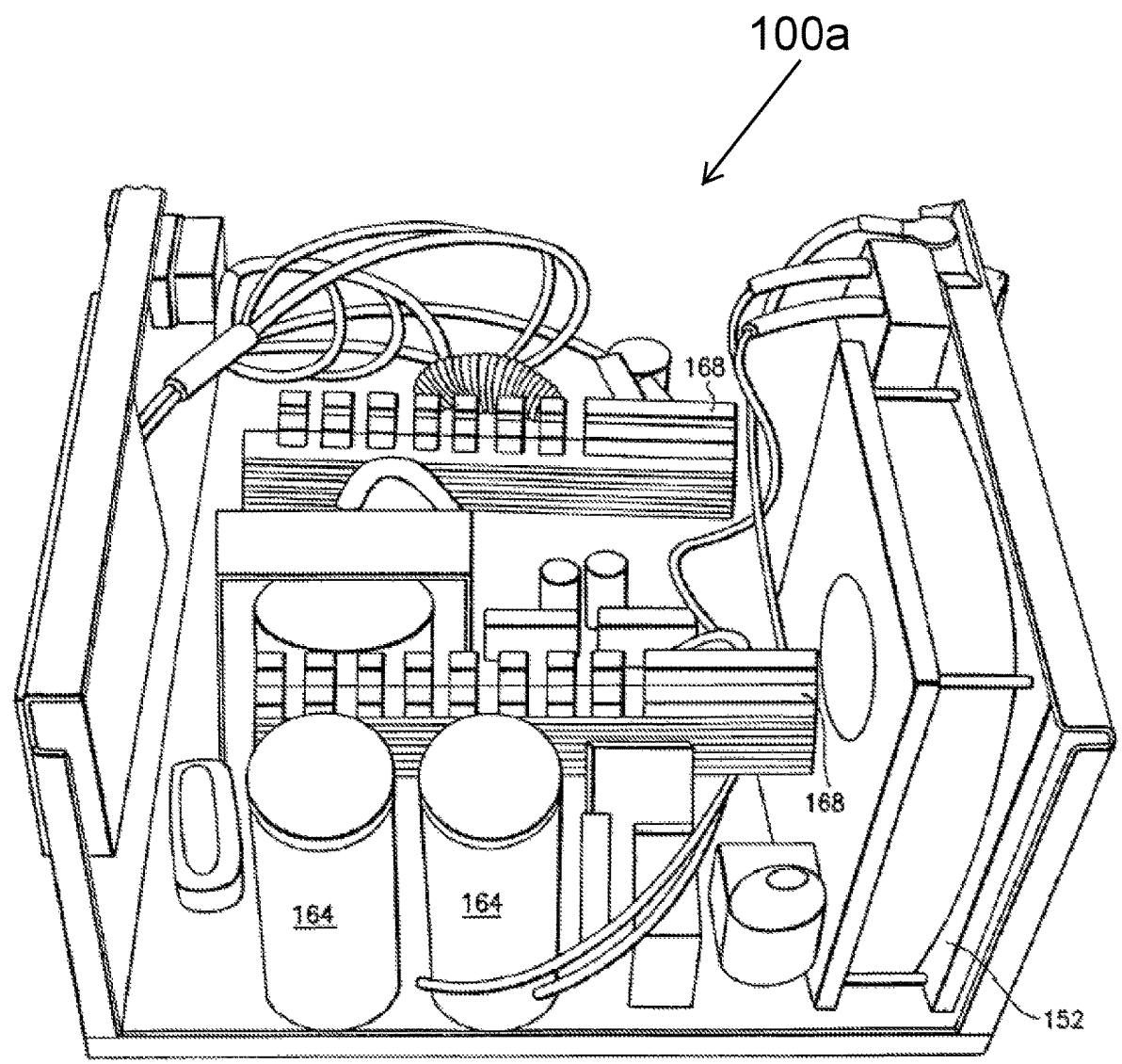
FIGS. 1A-1D illustrate a conventional power supply units and enclosures.
Figure 1B:
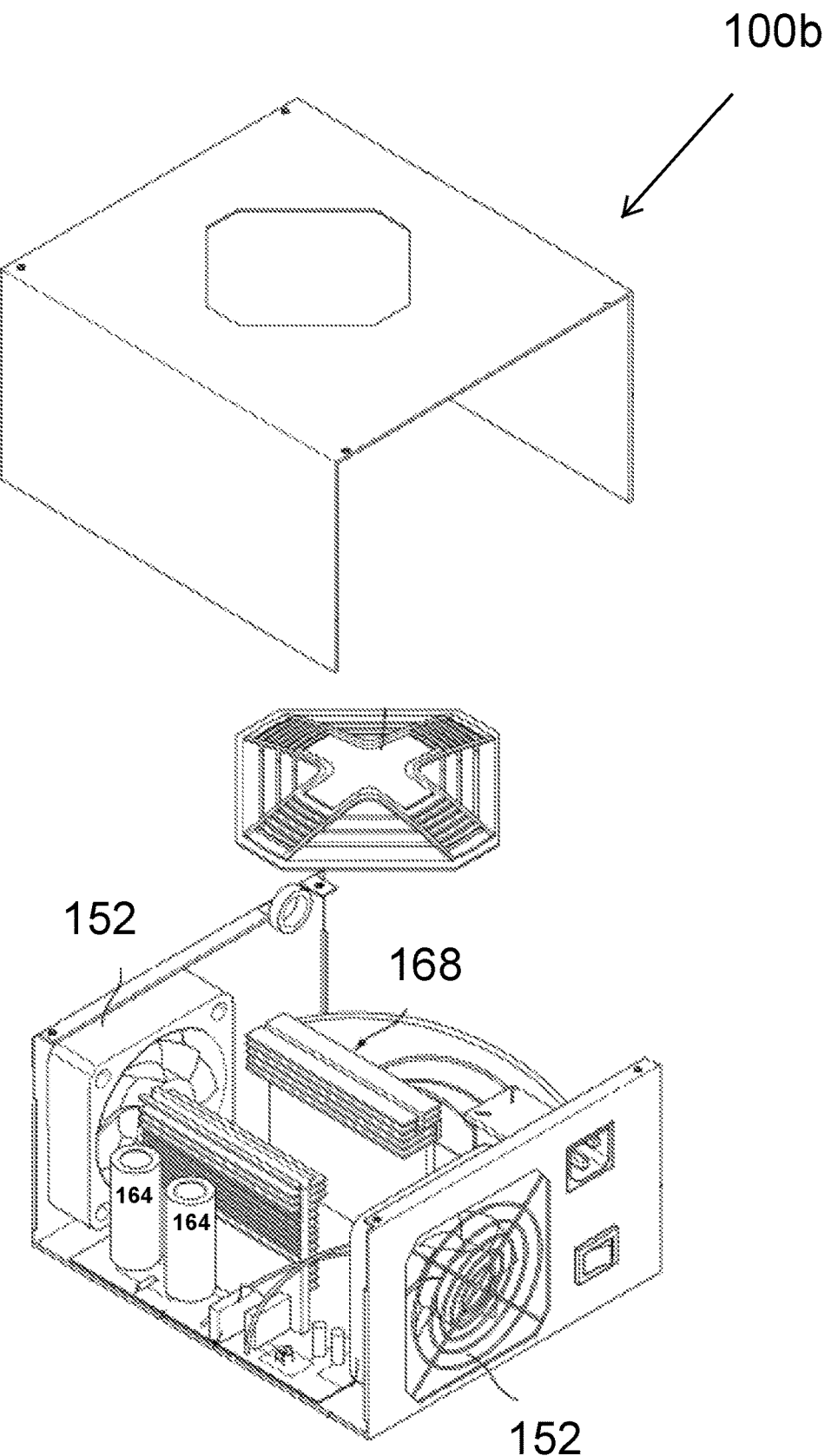
Figure 1C:
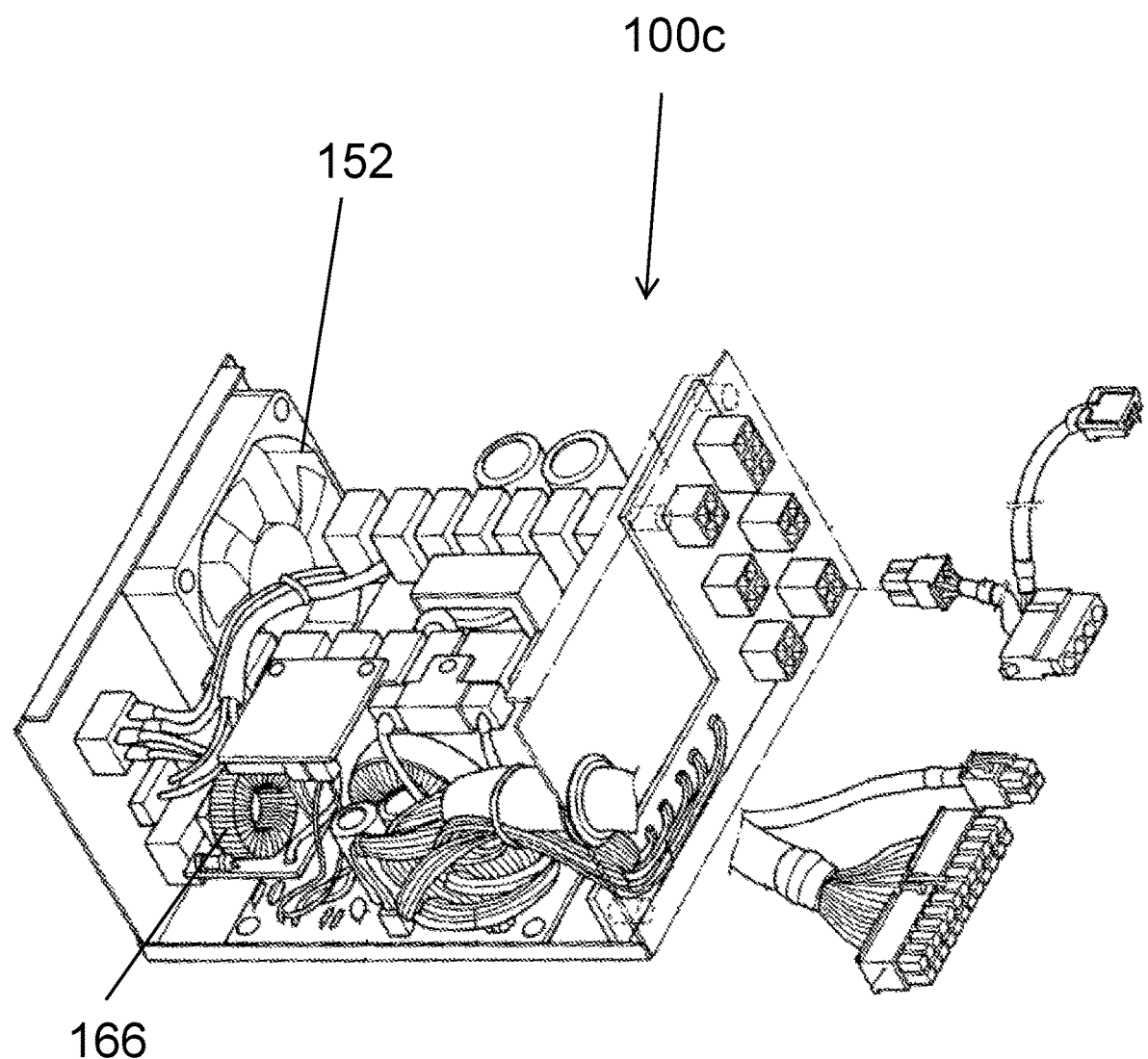
Figure 1D:
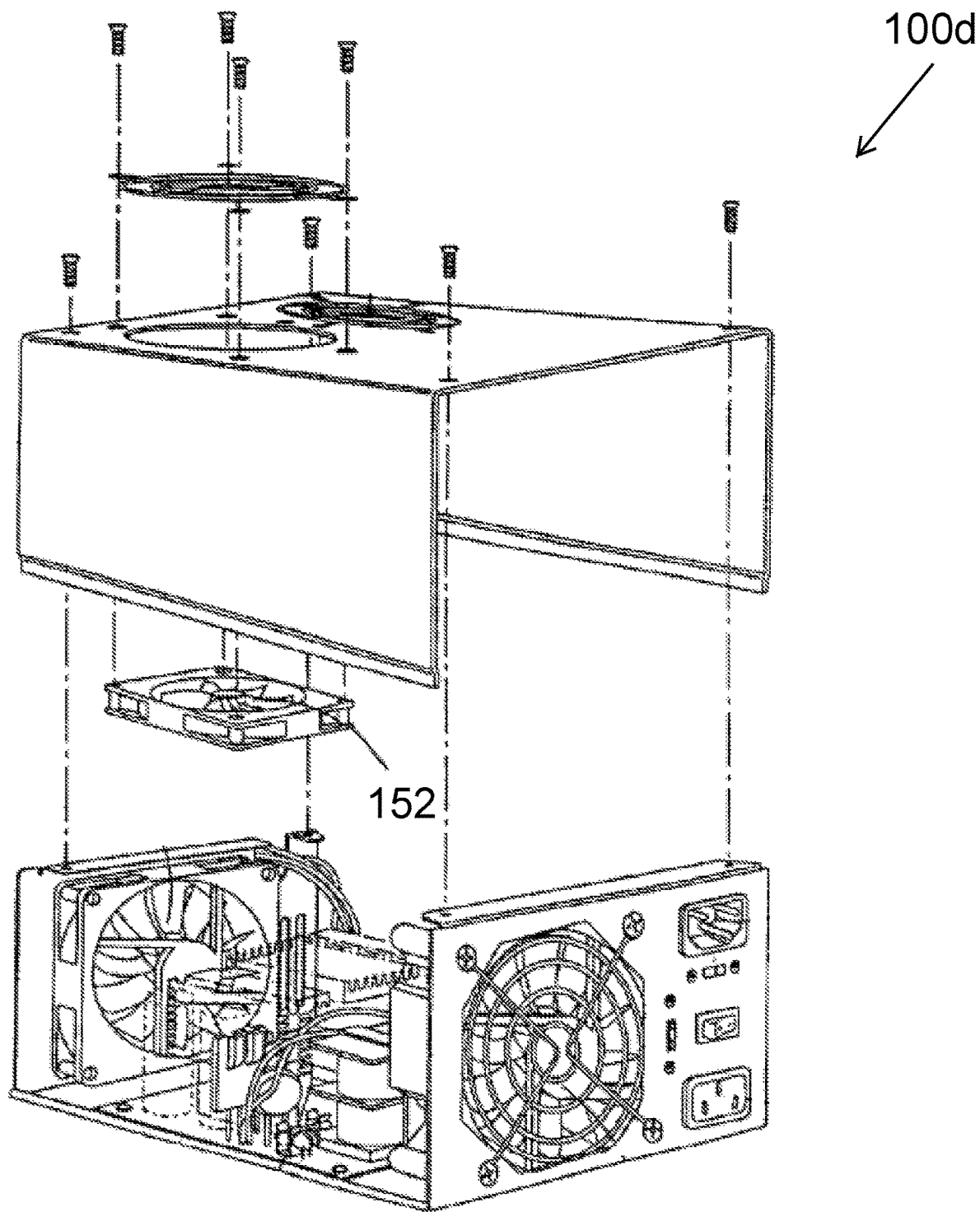

It should be understood that the drawings are not to scale and that the disclosed embodiments are sometimes illustrated diagrammatically and in partial views. In certain instances, details that are not necessary for an understanding of the disclosed method and apparatus, or that would render other details difficult to perceive may have been omitted. It should be understood that the present application is not limited to the particular embodiments illustrated herein.

DETAILED DESCRIPTION

Exemplary embodiments of the disclosure will now be described more fully with reference to the accompanying drawings. The invention can, however, be embodied in many different forms and should not be construed as being limited to the various embodiments set forth herein. Rather, these embodiments are provided to illustrate salient aspects of the disclosure, and so that this disclosure will be thorough and complete and will fully convey the scope of this discussion to those of ordinary skill in the relevant art.

Like numbers should be understood to refer to like elements, features and structures throughout. In the figures, the thickness of certain lines, layers, components, elements or features may be exaggerated for clarity. Where used, broken lines illustrate optional features or operations unless specified otherwise.

The terminology used herein is for the function of describing particular embodiments only and is not intended to be limiting. As used herein, the singular forms "a," "an" and "the" are intended to include plural forms as well, unless the context clearly indicates otherwise. It will be further understood that the terms "comprises" or "comprising," as used herein, encompass the notions of "including" and "having" and specify the presence of stated features, integers, steps, operations, elements components and/or groups or combinations thereof, but do not preclude the presence or addition of one or more other features, integers, steps, operations, elements, components and/or groups or combinations thereof.

The use of "for example" or "such as" to list illustrative examples does not limit to only the listed examples. Thus, "for example" or "such as" means "for example, but not limited to" or "such as, but not limited to" and encompasses other similar or equivalent examples.

As used herein, the term "and/or" includes any and all possible combinations or one or more of the associated listed items, as well as the lack of combinations when interpreted in the alternative ("or").

As used herein, the terms "embodiment" or "present embodiment" are non-limiting terms and not intended to refer to any single aspect of the particular embodiment but encompass all possible aspects as described in the specification and the claims.

Unless otherwise defined, all terms (including technical and scientific terms) used herein have the same meaning as knowingly understood by one of ordinary skill in the art to which example embodiments belong. It will be further understood that terms, such as those defined in knowingly used dictionaries, should be interpreted as having a meaning that is consistent with their meaning in the context of the specification and claims and should not be interpreted in an idealized or overly formal sense unless expressly so defined herein. Well-known functions or constructions may not be described in detail for brevity and/or clarity.

It will be understood that when an element is referred to as being "on," "assembled" to, "connected" to, "coupled" with, "contacting," etc., another element, it may be directly on, assembled to, connected to, coupled with and/or contacting the other element or intervening elements may also be present. In contrast, when an element is referred to as being, for example, "directly on," "directly assembled" to, "directly connected" to, "directly coupled" with or "directly contacting" another element, there are no intervening elements present. It will also be appreciated by those of ordinary skill in the relevant art that references to a structure or feature that is disposed "adjacent" another feature may have portions that overlap or underlie the adjacent feature.

Spatially relative terms, such as "under," "below," "lower," "over," "upper" and the like, may be used herein for ease of description to describe an element's or feature's relationship to another element's or feature's as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. Thus the exemplary term "under" may encompass both an orientation of over and under. The device may otherwise be oriented (rotated 90 degrees or at other orientations) and the spatially relative descriptors used herein interpreted accordingly. Similarly, the terms "upwardly," "downwardly," "vertical," "horizontal" and the like are used herein for the function of explanation only, unless specifically indicated otherwise.

It will be understood that, although the terms first, second, etc., may be used herein to describe various elements, components, regions, layers and/or sections, these elements, components, regions, layers and/or sections should not be limited by these terms. Rather, these terms are only used to distinguish one element, component, region, layer and/or section, from another element, component, region, layer and/or section. Thus, a first element, component, region, layer or section discussed herein could be termed a second element, component, region, layer or section without departing from the teachings of the present application. The sequence of operations (or steps) is not limited to the order presented in the claims or figures unless specifically indicated otherwise.

Exemplary embodiments described herein are generally directed to power supply assemblies (PSA) for desktop computers, servers or electronics systems. The power supply assemblies convert domestic high-voltage alternating current (AC) power (110 or 220/240 volt AC) into various regulated, low-voltage direct current (DC) power required by electronics system components that make up the electronics system.

The PSA generally comprises an AC/DC power supply unit (PSU) encased in a housing, one power cable, and a DC/DC converter module, encased or not encased in a housing. Those of ordinary skill in the relevant art may readily appreciate that the housing may be made of any suitable materials, including aluminum, dependent upon the working environment of the electronics system and the embodiments disclosed herein are not limited thereto. The PSU and moveable and interchangeable DC/DC converter module are mounted inside of the electronics system housing via screw and brackets; however, the embodiments described herein are not limited thereto. Any suitable fastening means known to those of ordinary skill in the related art may be employed. The DC/DC converter module is attached to the AC/DC power supply unit via the one power cable and is preferably ATX v2 compliant. An on/off switch and power cord socket are typically mounted on the back of the PSU. The one power cable may be mounted on the back or front of the PSU.

An ATX v2 compliant PSA may be turned on or off (or placed into standby mode) using signals generated by the motherboard. The amount of power required is dependent on the power requirements of the motherboard, processor and RAM, and number of add-on cards and peripheral devices drawing power from the PSA. Generally, the rated power output can range from around 400 watts up to 2 kilowatts, depending on the type of electronics system. Electronics systems used for gaming have much higher power requirements (typically 450 to 800 watts) due to high-end graphics adapters which consume large amounts of power. Network servers featuring multiple processors, multiple disk drives and multiple graphics cards generally have the highest power requirements. The PSA produces positive output voltages of +3.3 volts, +5 volts and +12 volts and negative voltages of −5 volts and −12 volts, along with a standby voltage of +5 volts. Those of ordinary skill in the relevant art may readily appreciate that in addition to the DC/DC converter module having a 24-pin power connector for attachment of a 24-pin P1 cable, the type and amount of connectors for attachment to the electronics system devices and wattage and efficiency can be varied for application-specific configurations, and the embodiments described herein are not limited thereto. For example, eight additional power connectors may be provided in the ATX v2 compliant DC/DC converter module, including one 8-pin +12 volts auxiliary motherboard connector used for extra power to the processor, one Molex 4-pin connector used for IDE drives such as hard drives, optical drives, and some video cards, four SATA connectors used for SATA drives such as hard drives and optical drives, and two 6-pin plus 2-pin +12 volts connectors used by high-end video cards using PCIe x16 slots to provide extra voltage to the cards. Those of ordinary skill in the relevant art may also readily appreciate that the DC/DC converter module may also comprise a semi-modular design, and the embodiments described herein are not limited thereto. As an example, the 24-pin P1 power connector and 8-pin +12 volts auxiliary motherboard connector may be permanently attached to the DC/DC converter module, whilst having seven connectors instead of nine.

The computer power supply assembly (PSA) of the exemplary embodiments described herein comprises detachable power cables, making cable management easier and increasing air-cooling efficiency within the electronics system housing. PSU size is minimized and greater design flexibility is available via the moveably and interchangeably attached DC/DC converter module for positioning anywhere within the electronics system housing, via the one power cable.

Figure 2A:
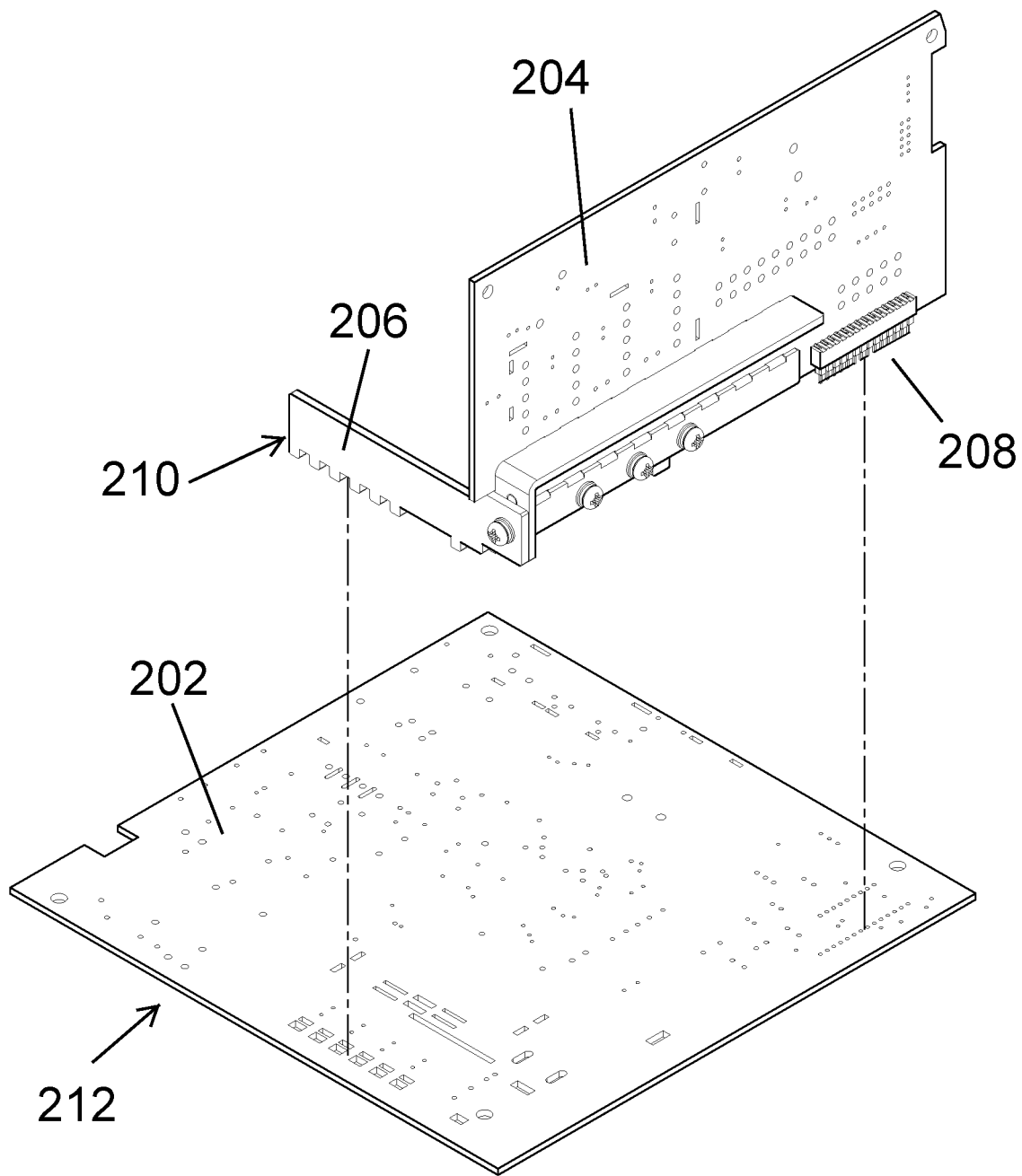
FIGS. 2A and 2B illustrates two modules connected by a bridge according to an exemplary embodiment of the invention.
Figure 2B:
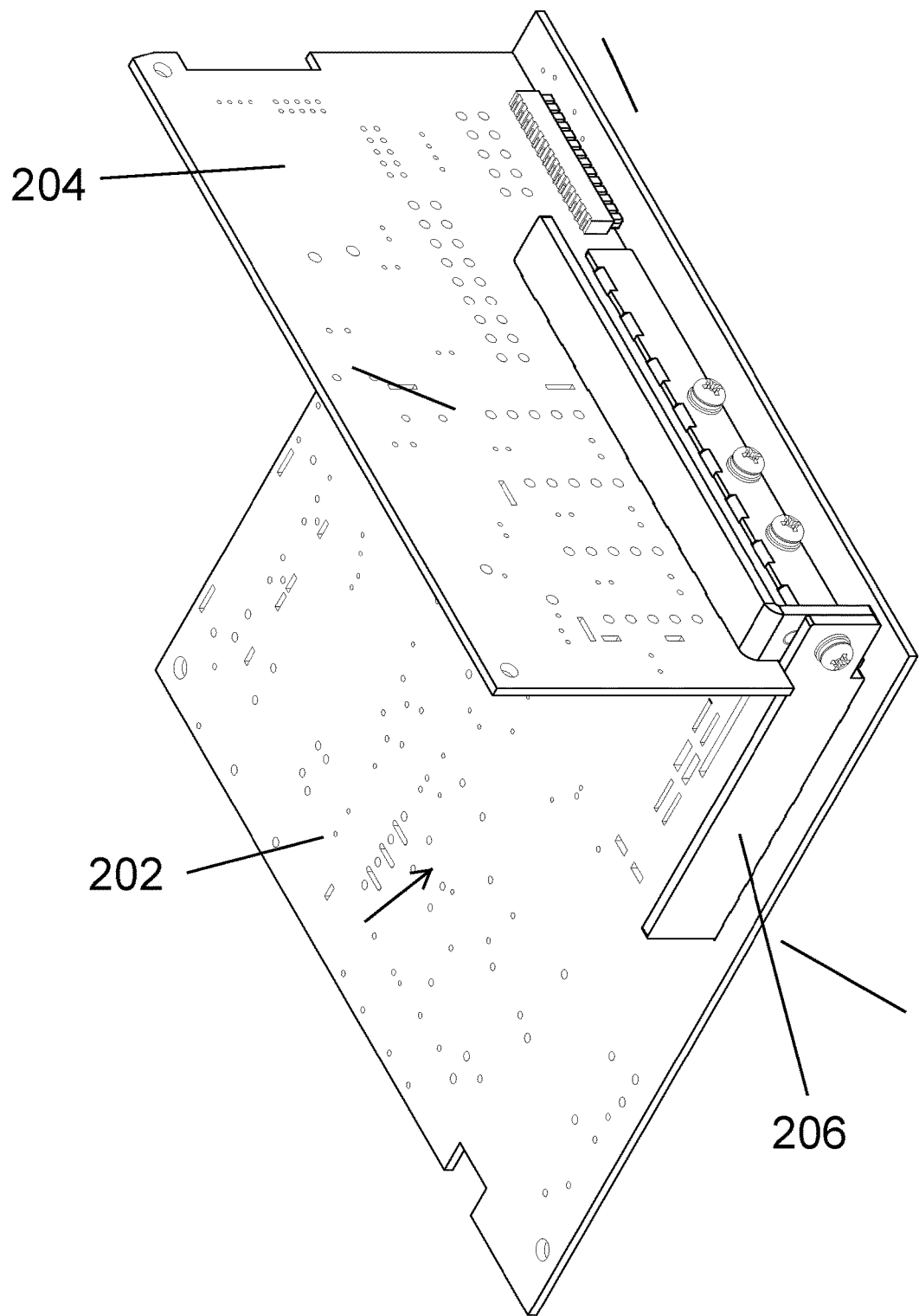

FIG. 2A illustrates an exemplary embodiment of the invention in a pre-assembled state. Illustrated are an AC/DC module 202 and a DC/DC module 204. A conducting bridge 206 is provided for electrically and mechanically connecting the AC/DC module 202 to the DC/DC module 204. The conducting bridge 206 is preferably mode of copper, but other suitable conducting materials including steel could be used. DC/DC module 204 also includes a connector 208 to provide DC current outputs back to the AC/DC module 202. By separating two functions: (a) converting AC to DC, and (b) converting the DC output to various low voltage DC supplies, several advantages are realized. First, the conductive bridge has a larger cross sectional area as compared to a conventional circuit trace. Accordingly, the resistance of the conductive bridge is considerably lower, and less waste heat is generated. The conductive bridge preferably forms a structural component in addition of conducting DC current. Advantageously, the conductive bridge can be formed to include a plug-like structure 210 to be received in a receptacle-like structure 212 on the AC/DC module 202. FIG. 2B illustrates the AC/DC module 202 connected to the DC/DC module 204 via conducting bridge 206. Conducting bridge 206 is the primary current carrier between AC/DC module 202 and DC/DC module 204, and also mechanically supports the two modules and fixes them in position relative to one another. Another advantage of separating the AC/DC module from the DC/DC module relates to improved upgradability. Given this structure, it is possible to replace the DC/DC module only to provide different and/or upgraded DC current outputs, while retaining the original AC/DC module.

Figure 3A:
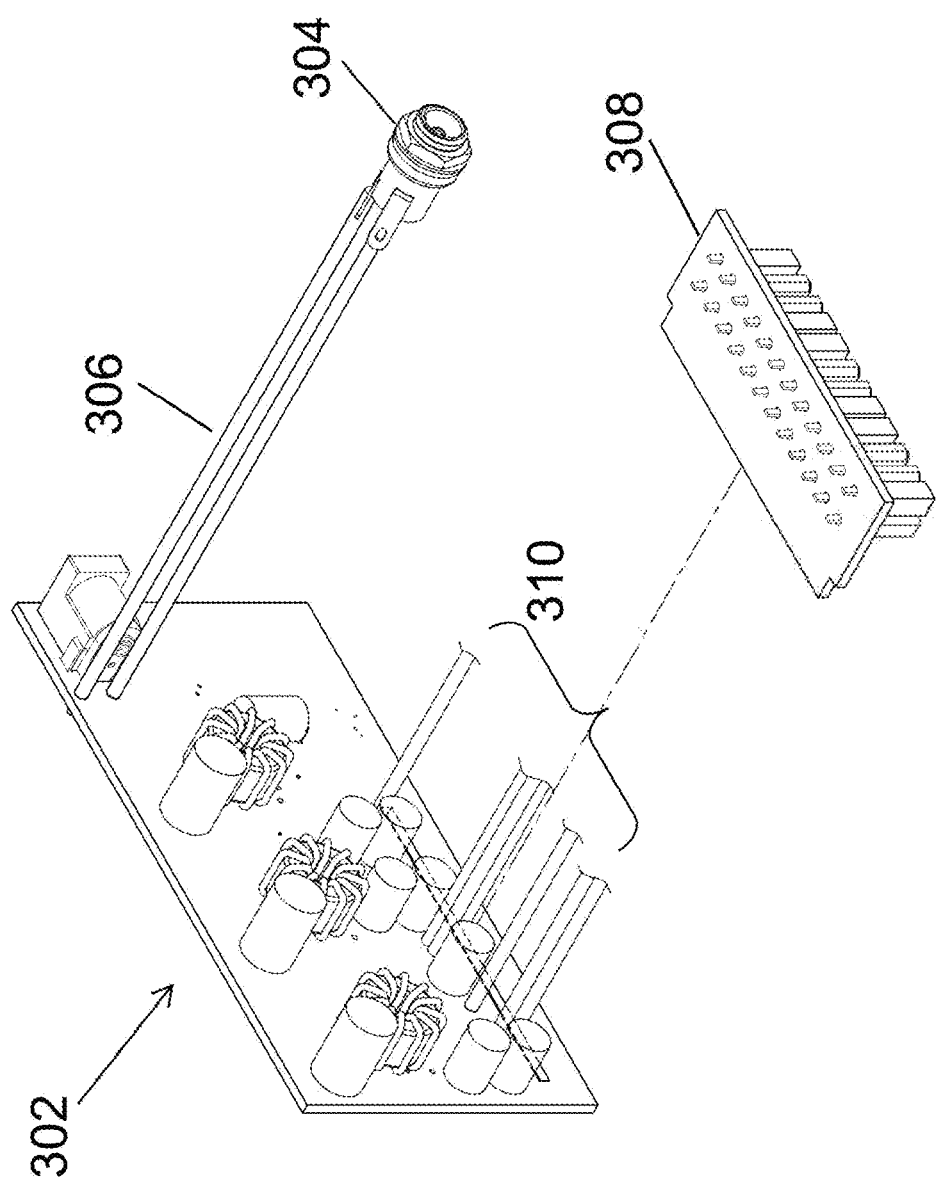
FIGS. 3A and 3B illustrate an alternate DC/DC module according to an exemplary embodiment of the invention.
Figure 3B:
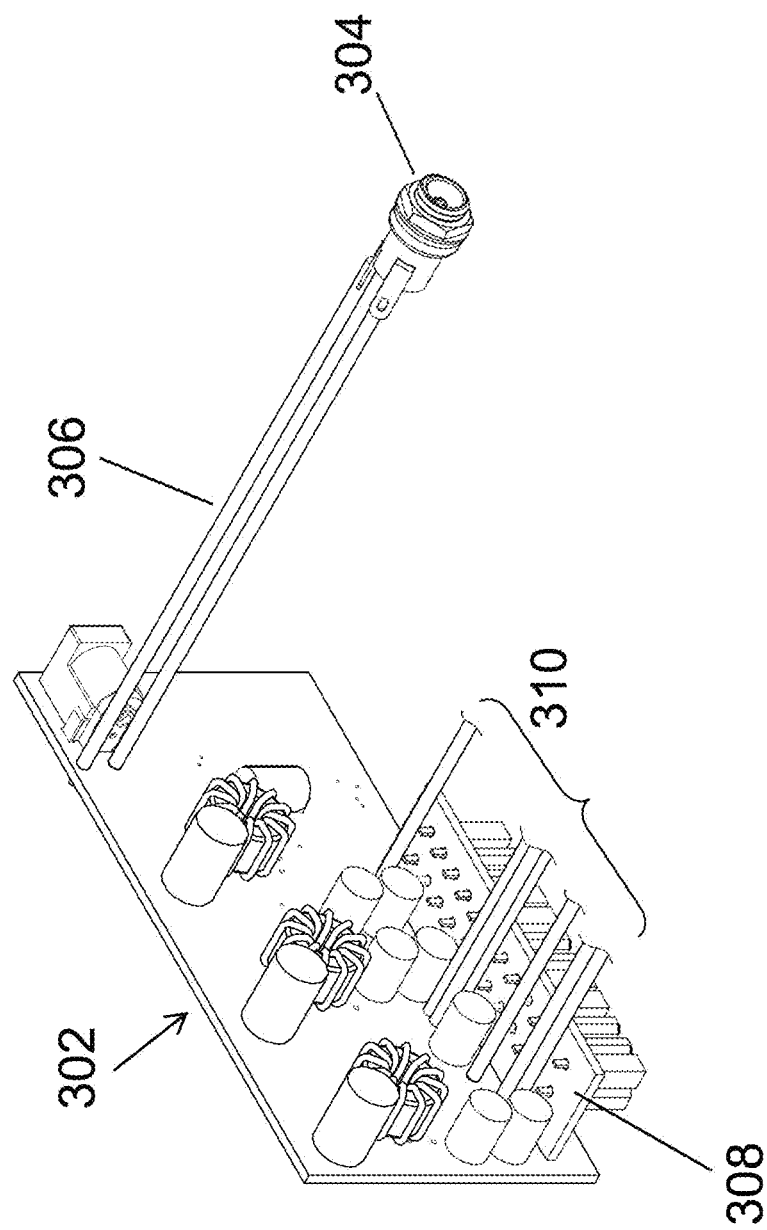

FIGS. 3A and 3B illustrate an alternate DC/DC module 302 according to an exemplary embodiment of the invention. This embodiment is substantially similar to the embodiment described above with regard to FIGS. 2A and 2B, but in place of the conductive bridge there is a DC input connector 304 and DC power conducting cable 306. A DC output connector 308 is provided, preferably in the form of a 24-pin connector. Such connectors may advantageously be plugged into a motherboard of, for example, a server. DC outputs 310 are preferably soldered to the DC output connector 308.

Figure 4A:
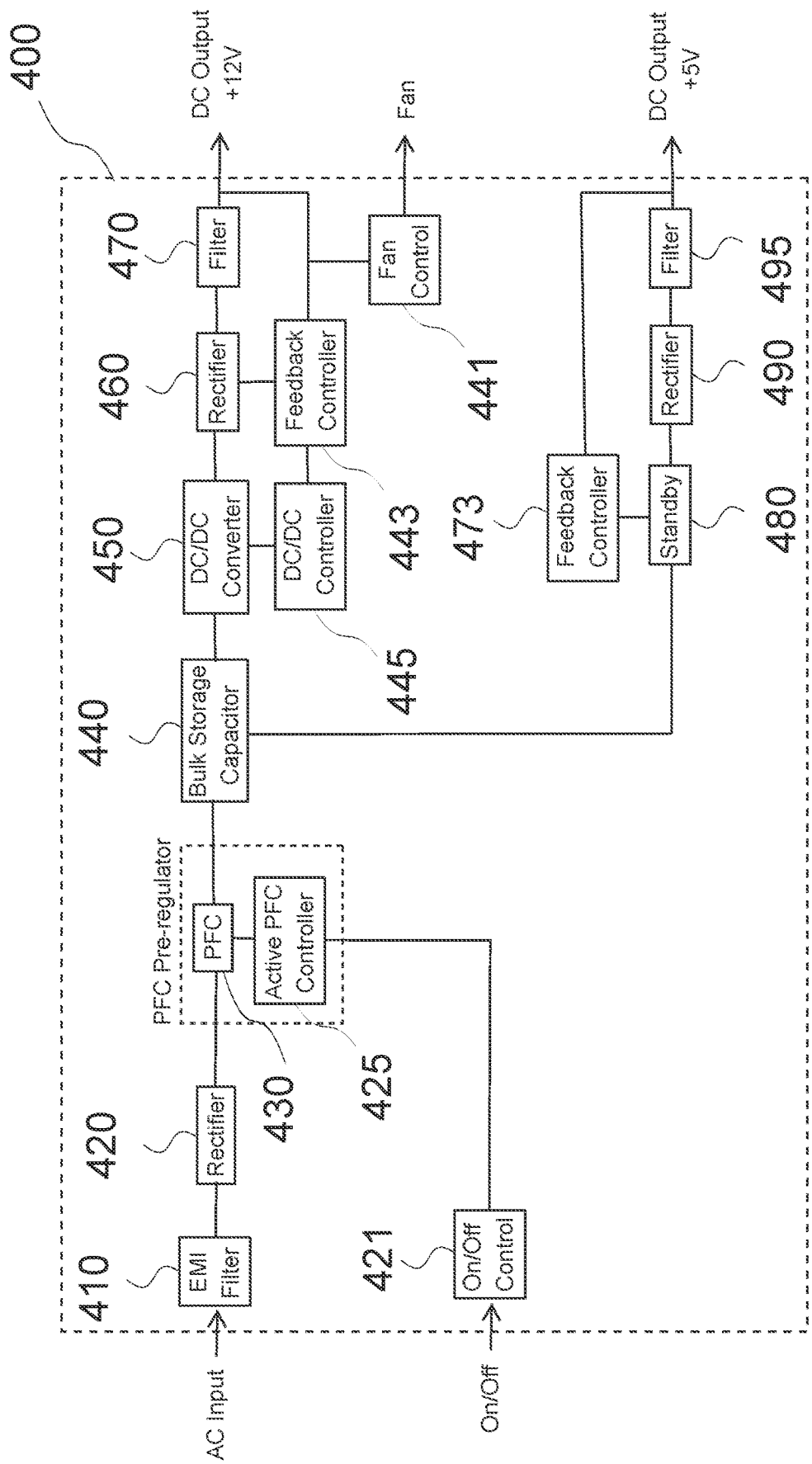
FIG. 4A is a block diagram of a power supply unit of a computer power supply assembly, according to an exemplary embodiment.
Figure 4B:
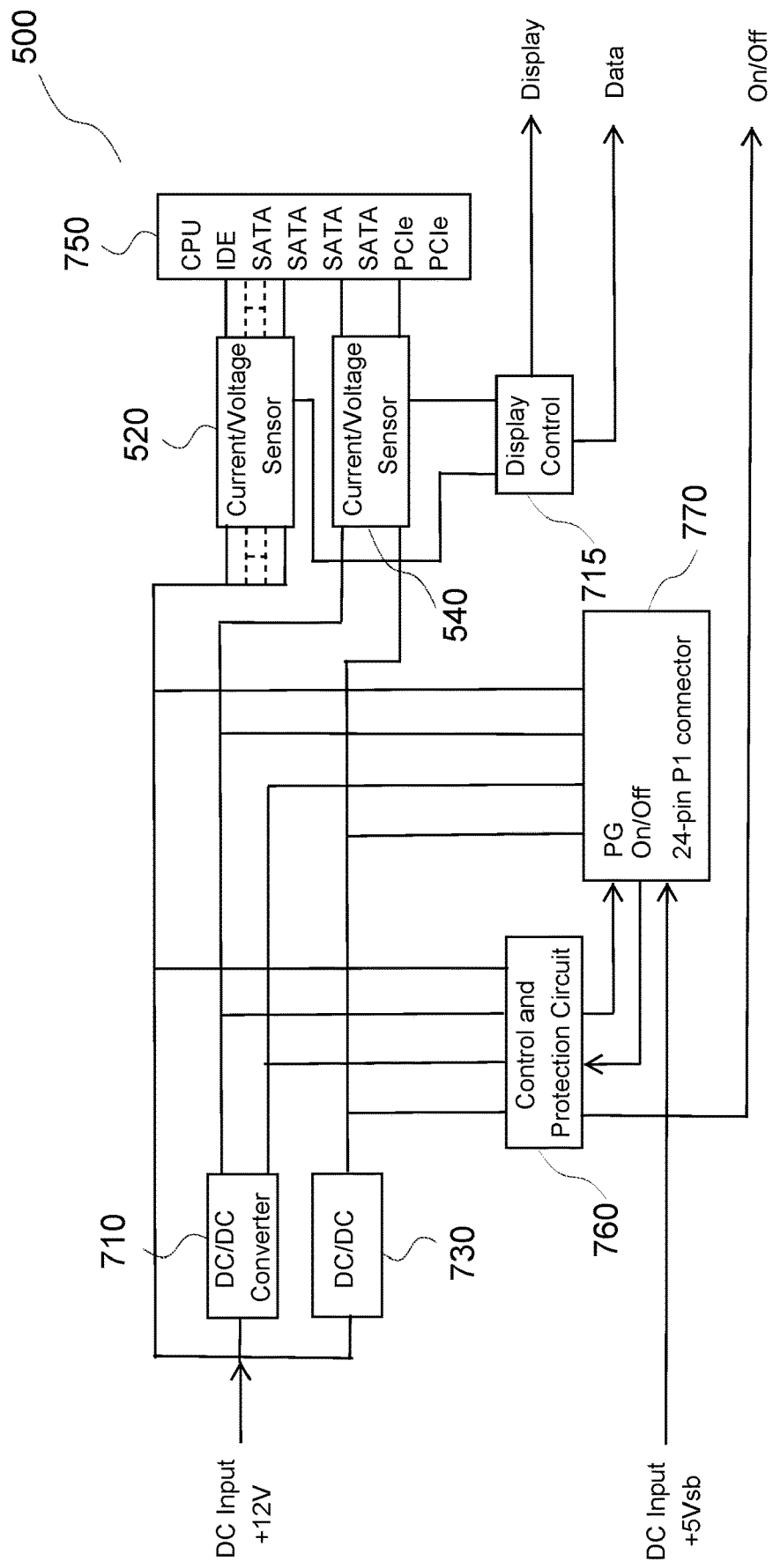
FIG. 4B is a block diagram of a converter module of the computer power supply assembly of FIG. 4A, according to an exemplary embodiment.
Figure 5A:
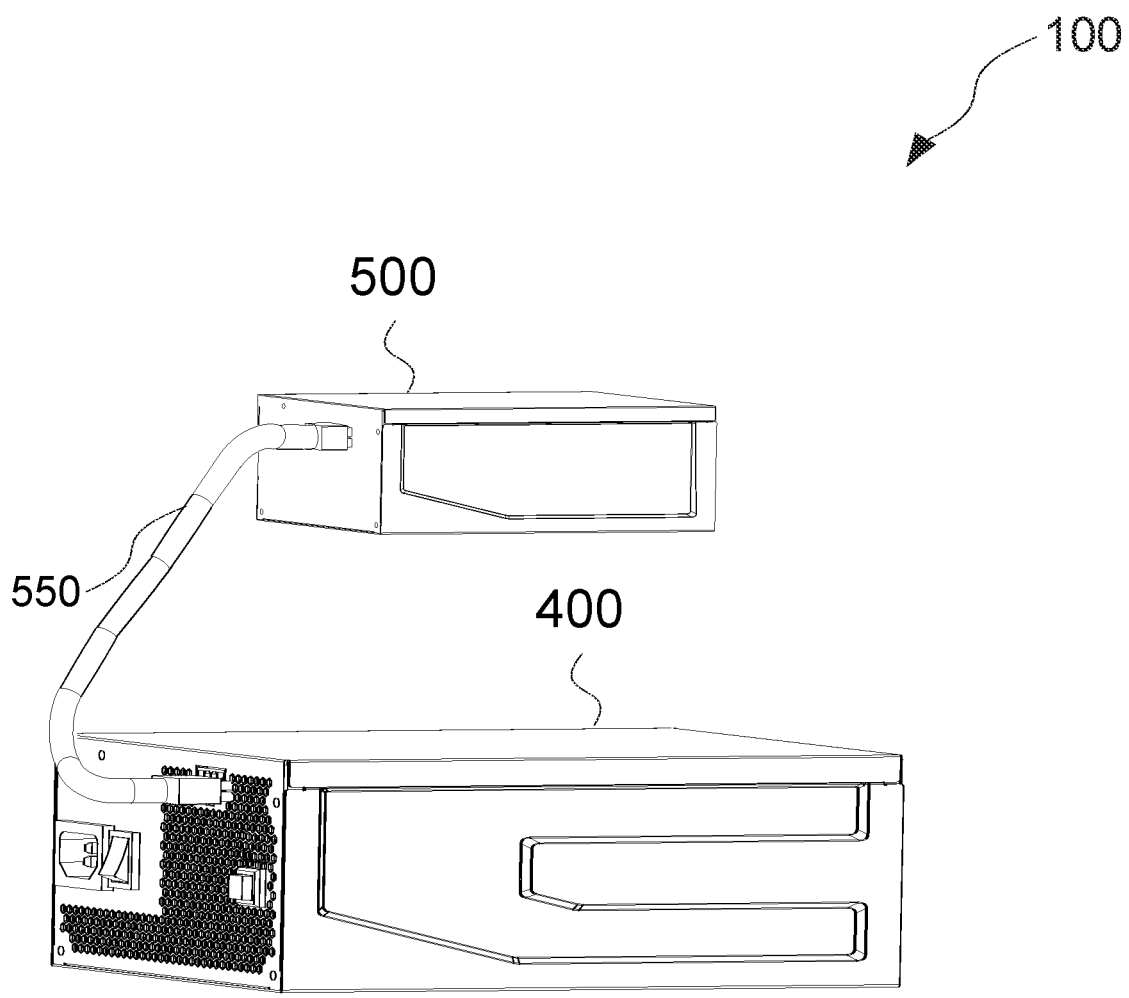
FIG. 5A is a schematic perspective view of a computer power supply assembly, according to an exemplary embodiment.
Figure 5B:
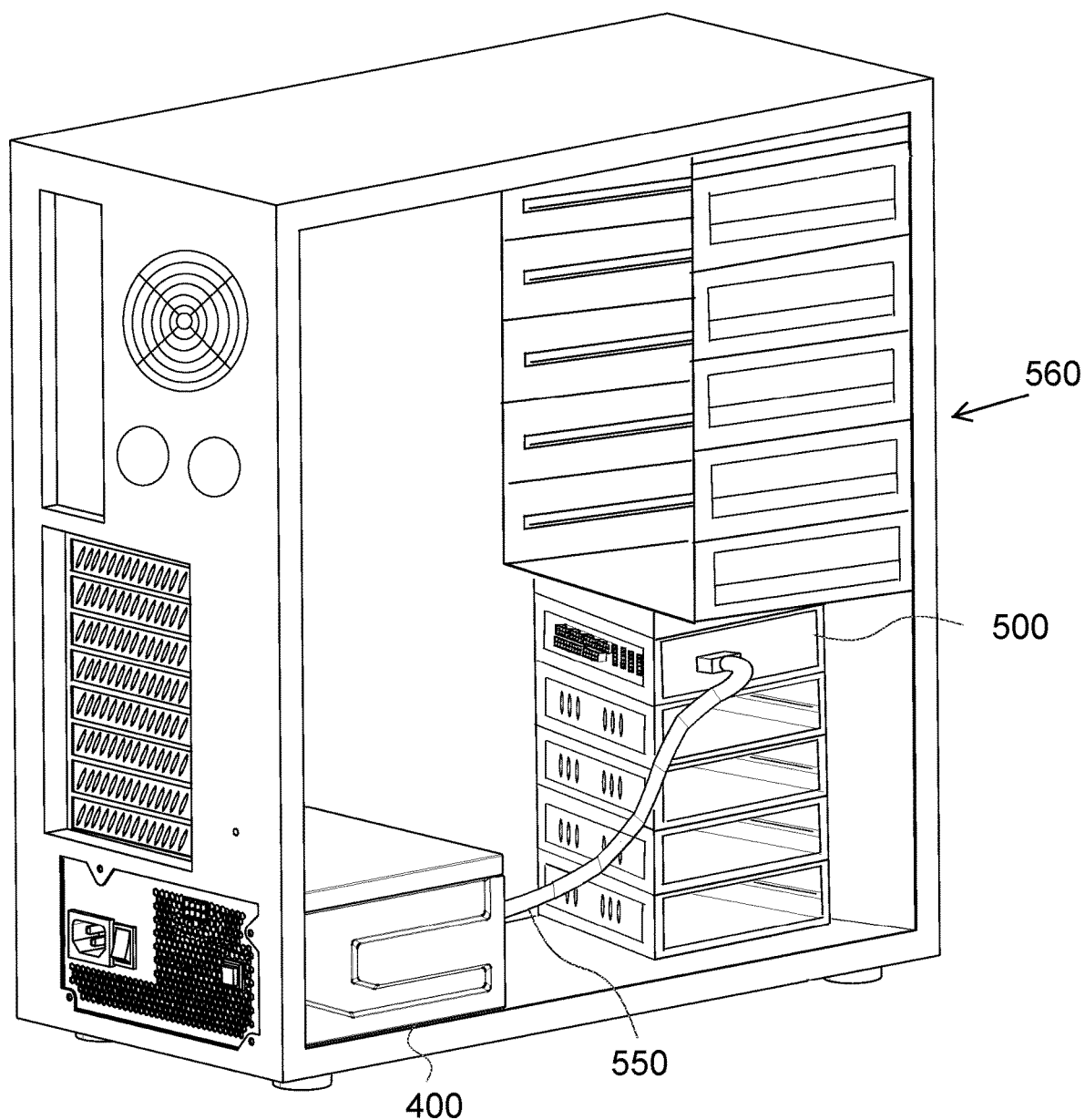
FIG. 5B is a schematic perspective view of the computer power supply assembly of FIG. 5A, assembled in a computer system, according to an exemplary embodiment.

FIG. 4A is a block diagram of a power supply unit of a computer power supply assembly, according to an exemplary embodiment. FIG. 4B is a block diagram of a converter module of the computer power supply assembly of FIG. 4A, according to an exemplary embodiment. FIG. 5A is a schematic perspective view of a computer power supply assembly, according to an exemplary embodiment. FIG. 5B is a schematic perspective view of the computer power supply assembly of FIG. 5A, assembled in a computer system, according to an exemplary embodiment. Referring to FIGS. 4A, 4B, 5A, and 5B, a computer power supply assembly 100 (see FIG. 5A) is provided, comprising an AC/DC power supply unit (PSU) 400, one power cable 550, and a DC/DC converter module 500. The PSU 400 converts high-voltage AC input power to a low-voltage DC output power. The DC/DC converter module 500 converts the low-voltage DC power to desired DC signals for various components of an electronics system. In some embodiments, a +5 volt standby DC signal and +12 volt DC signal is output from the PSU 400 and input to the DC/DC converter module 500. The DC/DC converter module 500 comprises a first current/voltage sensor 520 and second current/voltage sensor 540 configured to sense the DC output voltages across the load for the components of the electronics system.

In some embodiments, the PSU 400 comprises an EMI filter 410, at least one first rectifier 420, a PFC 430, an Active PFC controller 425, a bulk storage capacitor 440, a first DC/DC converter 450, a DC/DC controller 445, a feedback controller 443, at least one second rectifier 460, and a first filter 470. In some embodiments, the PSU 400 further comprises a fan controller 441. The fan controller 441 may monitor temperature of an external NTC thermistor and generate a PWM signal that can be used to control the speed of a fan.

The EMI filter 410, at least one first rectifier 420, PFC 430, and Active PFC controller 425, filter and rectify the AC input voltage, and calibrates the input current to ensure that the power factor of the input circuit is 0.95.

The EMI filter 410 attenuates the high frequency electromagnetic noise contained in the AC input voltage. In some embodiments, the EMI filter 410 comprises passive components, including capacitors and inductors, connected together to form LC circuits. Following, the attenuated AC signal from the EMI filter 410 is converted into a DC signal via the at least one rectifier 420.

In some embodiments, the at least one first rectifier 420 may be a bridge rectifier comprising four or more diodes in a bridge circuit. The bridge rectifier converts the AC input voltage into a DC signal. In alternative embodiments, the rectifier may comprise low-voltage MOSFETs, MOSFET and Schottky combos, diodes, rectifiers, bipolar transistors and JFETs. Next, the power factor of the DC signal from the at least one first rectifier 420 is increased and the harmonic currents therein are reduced via the PFC 430 and Active PFC controller 425.

In some embodiments, the Active PFC controller 425 is electrically connected to an on/off control 421 generating auxiliary supply voltage. The PFC 430 tracks the DC signal from the at least one first rectifier 420. The Active PFC controller 425 controls the PFC 430 to increase the power factor of the DC signal and decrease the harmonic currents therein. In some embodiments, the PFC 430 is a PFC correction converter and in some embodiments, the Active PFC controller 425 may comprise a critical-conduction mode (CrM), continuous-conduction mode (CCM), or discontinuous-conduction mode (DCM) PFC controller, depending upon requirements. Following, the bulk storage capacitor 440 ensures that the voltage travelling to the first DC/DC converter 450 does not drop too far during periods of intermittent unavailable voltage.

In some embodiments, the PSU 400 further comprises a standby converter 480, a feedback controller 473, at least one third rectifier 490, and a second filter 495 for standby voltage output of +5Vsb. In some embodiments, capacitors of the second filter 495 are used to smooth (filter) the pulsating DC signal after rectification via the at least one third rectifier 490 and conversion to +5V via the standby converter 480 by reducing the amount of ripple voltage contained therein. The feedback controller 473 controls and stabilizes the output voltage of the standby converter 480. In an exemplary embodiment, the bulk storage capacitor 440 additionally ensures that the voltage travelling to both the standby converter 480 and the first DC/DC converter 450 does not drop too far during periods of intermittent unavailable voltage.

In some exemplary embodiments, next, the first DC/DC converter 450, DC/DC controller 445, feedback controller 443, at least one second rectifier 460, and first filter 470, ensures that a steady DC voltage of +12V is output. In some embodiments, capacitors of the first filter 470 are used to smooth (filter) the pulsating DC signal after rectification via the at least one second rectifier 460 and conversion to +12V via the first DC/DC converter 450 by reducing the amount of ripple voltage contained therein. The DC/DC controller 445, electrically connected to the first DC/DC converter 450, tracks the DC signal from the bulk storage capacitor 240. The first DC/DC converter 450 converts the DC signal from the bulk storage capacitor 450 to +12V and the feedback controller 443 controls and stabilizes the output voltage therefrom. Preferably, the one power cable 550 comprising a +12V wire and a +5Vsb wire, electrically connects the PSU 400 to the DC/DC converter module 500 via connectors thereof; however, the exemplary embodiments are not limited thereto. Those of ordinary skill in the art may readily appreciate that other connection methods may be employed dependent upon requirements. As an example, and not to be limiting, the +12V wire and a +5Vsb wire may be permanently soldered to the PSU 400, and the cable may be connected to a connector of the DC/DC converter module 500. Any type of connection means known to those of skill in the relevant art may be employed in the embodiments.

In some embodiments, the DC/DC converter module 500 further comprises a second DC/DC converter 710, a third DC/DC converter 730, a control and protection circuit 760, a display control 715, a plurality of connectors 750, and a 24-pin P1 connector 770, in addition to the first current/voltage sensor 520 and second current/voltage sensor 540.

In some embodiments, the second DC/DC converter 710 and third DC/DC converter 730 are connected in parallel for efficiency, better heat dissipation and redundancy for reliability. In an exemplary embodiment, the steady DC voltage of +12V, output from the PSU 400 is input to the parallel connected second DC/DC converter 710 and third DC/DC converter 730. Following, the third DC/DC converter 730 outputs DC signals to the control and protection circuit 760, 24-pin P1 connector 770, and second current/voltage sensor 540. The second DC/DC converter 710 also outputs DC signals to the control and protection circuit 760, 24-pin P1 connector 770, and second current/voltage sensor 540.

In some embodiments, the control and protection circuit 760 shuts down or goes into other protection modes by activating protection circuits. The control and protection circuit 760 may comprise over & under voltage protection, over current protection, main and auxiliary opto drive and power good remote fault.

In some embodiments, the second current/voltage sensor 540 measures the DC and impulse signals etc. output from the parallel connected second DC/DC converter 710 and third DC/DC converter 730 and the first current/voltage sensor 520 measures the +12 volt DC signal and impulse signals etc. input from the PSU 400, before inputting the signals to the plurality of connectors 750.

In some embodiments, +12 volt, 3.3 volt, −12 volt, −5 volt, and 5 volt DC signals are output to the 24-pin P1 connector 770 via the second DC/DC converter 710 and third DC/DC converter 730.

In some embodiments, +12 volt, 3.3 volt, and 5 volt DC signals are output to the second current/voltage sensor 540, before being output to the plurality of connectors 750. In some embodiments, the plurality of connectors 750 comprise one 8-pin +12 volts auxiliary motherboard connector used for extra power to the processor, one Molex 4-pin connector used for IDE drives such as hard drives, optical drives, and some video cards, four SATA connectors used for SATA drives such as hard drives and optical drives, two 6-pin plus 2-pin +12 volts connectors used by high-end video cards using PCIe x16 slots to provide extra voltage to the cards.

Those of ordinary skill in the relevant art may readily appreciate that the components of the PSU 400 and DC/DC converter module 500 may be separate devices or devices embedded in circuit boards and the exemplary embodiments described herein are not limited thereto; as long as the functions of the devices described herein are able to be performed. Those of ordinary skill in the relevant art may also readily appreciate that the components of the devices of the PSU 400 and DC/DC converter module 500 may consist of components known to those of ordinary skill in the relevant art for implementation of the application-specific functions of the devices, and the embodiments are not limited thereto; as long as the application-specific functions of the devices are able to be performed.

In the exemplary embodiments, as illustrated in FIG. 5A, a computer power supply assembly is provided. The computer power supply assembly (PSA) 100 comprises an AC/DC power supply unit (PSU) 400, one power cable 550, and a DC/DC converter module 500. The DC/DC converter module 500 is moveably and interchangeably attached to the AC/DC power supply unit 400 via the one power cable 550 and is preferably ATX v2 compliant. The computer power supply assembly 100 achieves the benefits of a modular or semi-modular PSU, such as detachable power cables, easier cable management, and increased air-cooling efficiency throughout the inside of the electronics system housing, without the disadvantageous via the moveably and interchangeably attached DC/DC converter module 500. The larger size of the AC/DC power supply unit due to the end connectors is no longer a problem as the end connectors are now integrated into the DC/DC converter module. Additionally, due to the functional separation of the PSU into two (2) devices, heat build-up and noise in the PSU is minimized. In this embodiment the AC/DC power supply unit 400 and the DC/DC converter module 500 are each preferably housed in their own housing. Housing the various electronic components of the two units within a housing increases safety by reducing access to potentially dangerous voltages. Referring to FIG. 5B, the flexibility to position the small-sized DC/DC converter module 500 anywhere within the electronics system housing 560, via the one power cable 550, and nearest to the electronics system components most needing cables in a specialized electronics system, decreases time and complexity for cable management, as shorter cables is now available within the system. As an example and not to be limiting, in some embodiments, the DC/DC converter module 500 is preferably sized and shaped for installation into any sized standard peripheral bay, and can be assembled within any standard sized bay, including an internal 3.5" driver bay rack, SSD driver bay, railed bracket system, or any other suitably sized peripheral bay as are known to those of ordinary skill in the art, for minimal or no additional installation parts and minimal installation time. Those of ordinary skill in the relevant art can readily appreciate, that the DC/DC converter module 500 can also be assembled to other standard rack or railed bracket system within the electronics system and the embodiments are not limited thereto. In alternative embodiments, the DC/DC converter module 500 can be assembled within a standard external 5.25" drive bay via a 3.5 inch convertor attachment. In addition, PSU maintenance and management time and costs are decreased as should the new electronics system devices require increased wattage and efficiency, the entire PSU will not need to be replaced to maintain electronics system performance, just the DC/DC converter module having the required specifications.

Figure 6:
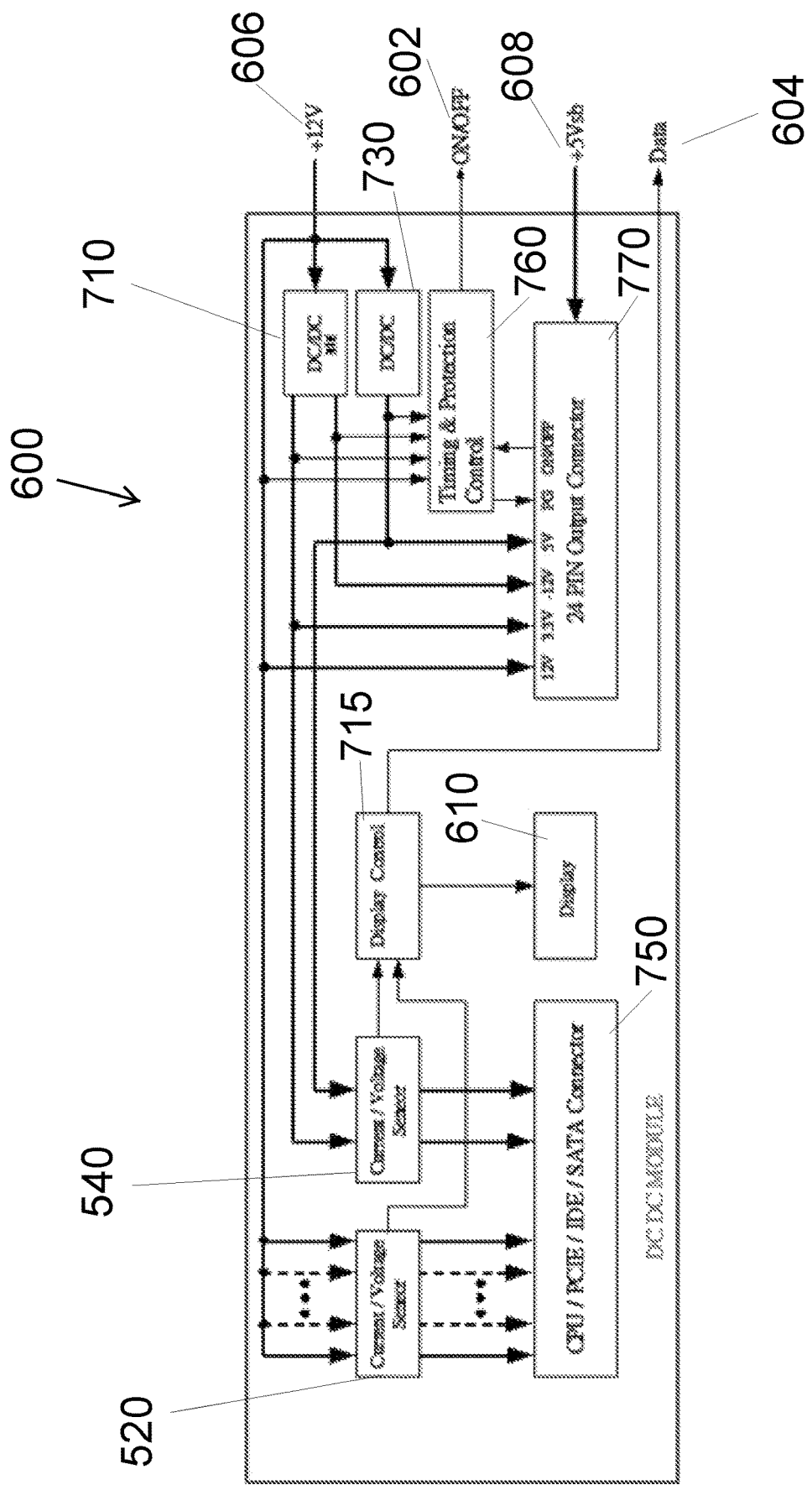
FIG. 6 is a block diagram of a DC/DC converter according to an exemplary embodiment.

Another exemplary embodiment of a DC/DC converter module 600 is illustrated in the functional block diagram of FIG. 6. The DC/DC module 600 of FIG. 6 is substantially similar to the DC/DC module of FIG. 4B, and accordingly like functional blocks are shown with the same reference numbers. Those component will not be described again, except as necessary to describe functional differences. The DC/DC module has an on/off control 602, data output 604 +12V input 606, +5V input 608, and an output display 610. Current and voltage sensor 520 senses voltage level and current supplied to connector 750 from the +12V input DC voltage 606. Current and voltage sensor 540 senses voltage level and current supplied from the output of DC/DC converter 710, that is 3.3V and 5V. Data regarding voltage levels and current supply are output to display control 715, and provided to display 610. In this manner, a user can easily see the voltages and currents being supplied by the power supply in real time. Display control 715 also preferably outputs data regarding voltage and current levels via data line 604 for use by another component. It should be appreciated that display 610 can take any reasonably form, and can be a simple indicator LED, an LCD matrix display, or any other suitable display, providing real time or historical information in numeric of graphic formats.

It is to be understood that the appended claims are not limited to express the particular elements, devices, or apparatuses described in this detailed description, which may vary between particular embodiments which fall within the scope of the appended claims. With respect to any Markush groups relied upon herein for describing particular features or aspects of various embodiments, different, special, and/or unexpected results may be obtained from each member of the respective Markush group independent from all other Markush members. Each member of a Markush group may be relied upon individually and or in combination and provides adequate support for specific embodiments within the scope of the appended claims.

Further, any ranges and subranges relied upon in describing various embodiments of the present disclosure independently and collectively fall within the scope of the appended claims, and are understood to describe and contemplate all ranges including whole and/or fractional values therein, even if such values are not expressly written herein. Those skilled in the relevant art readily recognizes that the enumerated ranges and subranges sufficiently describe and enable various embodiments of the present disclosure, and such ranges and subranges may be further delineated into relevant halves, thirds, quarters, fifths, and so on. As just one example, a range "of from 0.1 to 0.9" may be further delineated into a lower third, i.e., from 0.1 to 0.3, a third, i.e., from 0.4 to 0.6, and an upper third, i.e., from 0.7 to 0.9, which individually and collectively are within the scope of the appended claims, and may be relied upon individually and/or collectively and provide adequate support for specific embodiments within the scope of the appended claims. In addition, with respect to the language which defines or modifies a range, such as "at least," "greater than," "less than," "no more than," and the like, it is to be understood that such language includes subranges and/or an upper or lower limit. As another example, a range of "at least 7" inherently includes a subrange of from at least 7 to 35, a subrange of from at least 7 to 25, a subrange of from 25 to 35, and so on, and each subrange may be relied upon individually and/or collectively and provides adequate support for specific embodiments within the scope of the appended claims. Finally, an individual number within a disclosed range may be relied upon and provides adequate support for specific embodiments within the scope of the appended claims. For example, a range "of from 1 to 9" includes various individual integers, such as 3, as well as individual numbers including a decimal point (or fraction), such as 4.1, which may be relied upon and provide adequate support for specific embodiments within the scope of the appended claims.

The present application has been described herein in an illustrative manner, and it is to be understood that the terminology which has been used is intended to be in the nature of words of description rather than of limitation. Many modifications and variations of the present embodiments are possible in light of the above teachings. The present application may be practiced otherwise than as specifically described within the scope of the appended claims. The subject matter of all combinations of independent and dependent claims, both single and multiple dependent, is herein expressly contemplated.

What is claimed is:

1. A computer power supply assembly, comprising:
   an AC/DC power supply unit comprising a first planar circuit board adapted to convert input AC power to output DC power;
   a DC/DC power converter module comprising a second planar circuit board; and
   a power conductor connecting at least one DC power output of the AC/DC power supply to at least a DC power input of the DC/DC power converter;

wherein the power conductor is a rigid conducting bridge that conducts current between the AC/DC power supply unit and the DC/DC power converter and mechanically connects the AC/DC power supply unit to the DC/DC power converter; and rigidly holds the AC/DC power supply unit first planar circuit board in fixed relation to and perpendicular to the DC/DC power converter second planar circuit board;

wherein the DC/DC power converter receives the 5V DC power input and the 12V DC power input from the AC/DC power supply unit and converts the 5V DC and the 12V DC power input signals to a plurality of DC outputs and provides the plurality of DC outputs to a plurality of DC power connectors;

wherein the DC/DC power converter module comprises a first DC/DC converter and a second DC/DC converter, first and second current/voltage sensors, a control and protection circuit, and a 24-pin P1 connector;

wherein the first and second DC/DC converters each output DC signals to the respective first and second current/voltage sensors, to the control and protection circuit, and to the 24-pin P1 connector;

wherein the power conductor comprises a plurality of teeth that electrically connect the power conductor to holes of the AC/DC power supply unit first planar circuit board.

2. The computer power supply assembly of claim 1, wherein the DC/DC power converter provides any of (a) 12 volt DC power output to an 8-pin auxiliary motherboard connector, (b) a DC power output to a Molex 4-pin connector, (c) a DC power output to four SATA connectors, (d) a DC power output to two 6-pin plus 2-pin +12 volt PCIe x16 connectors.

3. The computer power supply assembly of claim 1, wherein the DC/DC power converter is ATX v2 compliant.

4. A method of manufacturing a computer power supply assembly comprising the steps of:
providing an AC/DC power supply on a first planar circuit board;
providing a DC/DC power converter module on a second planar circuit board;
connecting a DC power output of the AC/DC power supply unit to a DC power input of the DC/DC power converter module with a rigid conducting bridge that conducts current between the AC/DC module and the DC/DC converter and rigidly holds the AC/DC module first planar circuit board in fixed relation to and perpendicular to the DC/DC converter second planar circuit board; and
converting the DC power input to respective first and second DC/DC power converters, and connecting the output of the first and second DC/DC power converters to a control and protection circuit, and to a 24-pin P1 connector, and providing the DC outputs to a plurality of DC power connectors;
wherein the DC/DC power converter module comprises a first DC/DC converter and a second DC/DC converter, first and second current/voltage sensors, a control and protection circuit, and a 24-pin P1 connector;
wherein the rigid conducting bridge comprises a plurality of teeth that electrically connect the rigid conducting bridge to holes of the AC/DC power supply unit first planar circuit board.

5. The method of claim 4, further comprising the step of providing any of (a) 12 volt DC power output to an 8-pin auxiliary motherboard connector, (b) a DC power output to a Molex 4-pin connector, (c) a DC power output to four SATA connectors, (d) a DC power output to two 6-pin plus 2-pin +12 volt PCIe x16 connectors.

6. The method of claim 4, wherein the DC/DC converter is ATX v2 compliant.

7. A computer power supply assembly, comprising:
an AC/DC power supply unit comprising a first planar circuit board adapted to convert input AC power to output DC power;
a DC/DC power converter module comprising a second planar circuit board and at least two current or voltage sensors for sensing a current or voltage being supplied from the DC/DC power converter module,
a display which displays the current or voltage sensed by the sensor; and
a rigid power conductor connecting at least one DC power output of the AC/DC power supply to at least a DC power input of the DC/DC power converter and rigidly holding the AC/DC power supply unit first planar circuit board in fixed mechanical relation to and perpendicular to the DC/DC power converter second planar circuit board;
wherein the DC/DC power converter comprises a first DC/DC converter, a second DC/DC converter, a control and protection circuit, a 24-pin P1 connector and a plurality of DC outputs, wherein the first and second DC/DC converters convert the DC power input and supply the converted DC power to a control and protection circuit, a 24-pin P1 connector and a plurality of DC outputs and provides the plurality of DC outputs to a plurality of DC power connectors;
wherein the power conductor comprises a plurality of teeth that electrically connect the power conductor to holes of the AC/DC power supply unit first planar circuit board.

8. The computer power supply assembly of claim 7, wherein the DC/DC power converter provides any of (a) 12 volt DC power output to an 8-pin auxiliary motherboard connector, (b) a DC power output to a Molex 4-pin connector, (c) a DC power output to four SATA connectors, (d) a DC power output to two 6-pin plus 2-pin +12 volt PCIe x16 connectors.

9. The computer power supply assembly of claim 7, wherein the DC/DC power converter is adapted for mounting to an internal drive bay.

10. The computer power supply assembly of claim 7, wherein the DC/DC power converter is adapted for mounting to a SSD drive bay.

11. The computer power supply assembly of claim 7, wherein the DC/DC power converter is adapted for mounting to a railed bracket system.

12. The computer power supply assembly of claim 7, wherein the DC/DC power converter is ATX v2 compliant.

13. The computer power supply assembly of claim 7, wherein the AC/DC power supply unit is in a first housing and the DC/DC converter module is in a second housing.

14. The computer power supply assembly of claim 7, wherein the power conductor is a conductive cable having a connector.

15. The computer power supply assembly of claim 14, wherein the connector is a twist connector.

* * * * *